(12) United States Patent
Shingubara et al.

(10) Patent No.: US 6,852,624 B2
(45) Date of Patent: Feb. 8, 2005

(54) ELECTROLESS PLATING PROCESS, AND EMBEDDED WIRE AND FORMING PROCESS THEREOF

(75) Inventors: Shoso Shingubara, Higashi-Hiroshima (JP); Takayuki Takahagi, Aki-gun (JP); Hiroyuki Sakaue, Higashi-Hiroshima (JP)

(73) Assignee: Semiconductor Technology Academic Research Center, Kanagawa (JP)

( * ) Notice: Subject to any disclaimer, the term of this patent is extended or adjusted under 35 U.S.C. 154(b) by 0 days.

(21) Appl. No.: 10/233,605

(22) Filed: Sep. 4, 2002

(65) Prior Publication Data

US 2003/0068887 A1 Apr. 10, 2003

(30) Foreign Application Priority Data

Oct. 5, 2001 (JP) ........................................ 2001-309885

(51) Int. Cl.⁷ ............................. H01L 21/00; H01B 1/00
(52) U.S. Cl. ........................ 438/678; 438/687; 174/68.1
(58) Field of Search ................................. 438/678, 687; 174/68.1

(56) References Cited

U.S. PATENT DOCUMENTS 5,712,193 A * 1/1998 Hower et al. ............... 438/643
5,891,513 A * 4/1999 Dubin et al. ................... 427/98
6,169,027 B1 * 1/2001 Dobson ....................... 438/653

FOREIGN PATENT DOCUMENTS

| JP | 2000-49119 A | 2/2000 |
| KR | 1999-0088541 A | 12/1999 |

* cited by examiner

Primary Examiner—Evan Pert
(74) Attorney, Agent, or Firm—Nixon & Vanderhye, P.C.

(57) ABSTRACT

The present invention is to provide a process for forming the embedded wires having the higher density and the finer pitch without using catalyzing agent in an economical manner. The electroless plating process of copper according to the present invention includes steps of preparing a substrate, and forming a metal nitride layer containing high melting-point metal on the substrate. The metal nitride layer has a stabilized nitride layer in the vicinity of a top surface thereof. The stabilized nitride layer has a composition ratio of nitrogen atoms over oxygen atoms, which is about 0.4 or more. The process also includes a step of immersing the substrate into a plating solution containing copper so as to displace high melting-point metal contained in the metal nitride layer by copper, thereby forming an electroless copper plating layer on the metal nitride layer.

19 Claims, 4 Drawing Sheets

ELECTROLESS PLATING PROCESS, AND EMBEDDED WIRE AND FORMING PROCESS THEREOF

CROSS-REFERENCE TO RELATED APPLICATIONS

A related patent application is a commonly assigned Japanese Patent Application No. 2001-309885 filed on Oct. 5, 2001, which is incorporated by reference into the present patent application to establish an earlier effective filing date under 35 U.S.C. 119.

BACKGROUND OF THE INVENTION

1) Technical Field of the Invention

The present invention relates to a process of forming an embedded copper wire, and in particular, relates to process of forming the embedded wire by electroless plating.

2) Description of Related Arts

A damascene process can be utilized to obtain a high density of semiconductor devices. In the damascene process, flat circuits are formed with patterned wires of copper that are embedded In an insulating layer. In the damascene process, first, a hole and/or trench is formed on the insulating layer. Then, a barrier metal layer of metal such as TaN and WN is deposited on the inner side wall of the hole by sputtering or chemical vapor deposition (CVD). Since the barrier metal has a high electric resistance, a seed layer of copper having thickness of around 10 mn is laminated on the barrier metal layer by sputtering. Lastly, an electroplating process is used to form a copper layer on the seed layer and fill up the hole so that the embedded wires of copper are completed.

The high density and the fine pitch of the patterned wires of the semiconductor device hamper formation of the homogeneous seed layer in a sputtering operation. For example, as the aspect ratio of the hole and/or trench is increased, it is more difficult by a sputtering operation to achieve formation of the homogeneous seed layer on the inner side wall thereof. The side coverage on the walls is substantially reduced. Thus, the electroplating process for forming the plating layer on the seed layer is inadequate to fill up the fine bole with homogenous copper plating layer.

A particular and expensive sputtering systems such as the advanced ionized directional sputter deposition system and the long distance sputter deposition system may be used to improve the side coverage of the seed layer. Nonetheless, such systems may make the conventional electroplating process available for at most another generation in the innovation of the semiconductor devices, and eventually, the conventional electroplating process for forming the embedded wire would dead-end.

Therefore, the present invention provides a process for forming the embedded wires with higher density and with finer pitch, but without using a catalyzing agent.

SUMMARY OF THE INVENTION

The present inventors have dedicated to find a process for forming a barrier metal layer by electroless plating. The barrier metal is made of high melting-point metal or high melting-point metal nitride including a stabilized nitride layer in the vicinity of a top surface thereof. The electroless plating process eliminates use of the catalyzing layer to form the embedded wire.

The electroless plating process of copper according to first aspect of the present invention includes steps of preparing a substrate, and forming a metal nitride layer containing high melting-point metal on the substrate. The metal nitride layer has a stabilized nitride layer in the vicinity of a top surface thereof. Also, the stabilized nitride layer has a composition ratio of nitrogen atoms over oxygen atoms, which is about 0.4 or more. The process also includes a step of immersing the substrate into a plating solution containing copper so as to displace high melting-point metal contained in the metal nitride layer by copper, thereby forming an electroless copper plating layer on the metal nitride layer.

The electroless plating process of copper according to second aspect of the present invention includes steps of preparing a substrate, and forming a metal layer on the substrate, the metal layer mainly made of high melting-point metal selected from a group consisting of titanium, cobalt, and alloy thereof. The process also includes a step of immersing the substrate into a plating solution containing copper so as to displace high melting-point metal by copper, thereby forming an electroless copper plating layer on the metal nitride layer.

The electroless plating process of copper according to third aspect of the present invention includes steps of preparing a substrate forming a pit on the substrate, and forming a barrier metal layer containing high melting-point metal on the substrate. The barrier metal layer has a stabilized nitride layer in the vicinity of a top surface thereof. The stabilized nitride layer has a composition ratio of nitrogen atoms over oxygen atoms, which is about 0.4 or more. The process also includes a step of immersing the substrate into a plating solution containing copper so as to displace high melting-point metal contained in the barrier metal layer by copper, thereby forming an electroless copper plating layer on the metal nitride layer.

The embedded wire of copper according to fourth aspect of the present invention includes a substrate, a pit formed on the substrate, and a barrier metal layer of metal nitride containing high melting-point metal formed on an inner side wall of the pit. A copper plating layer is formed on the barrier metal layer, filling the pit up with copper metal. A stabilized nitride layer is formed at an interface between the barrier metal layer and the copper plating layer. The stabilized nitride layer has a composition ratio of the number of nitrogen atoms over the number of oxygen atoms contained therein, which is about 0.4 or more.

It should be noted that as long as the aforementioned composition ratio of the number of nitrogen atoms over the number of oxygen atoms is about 0.4 or more, it can also be about 1.5 or more.

Further scope of applicability of the present invention will become apparent from the detailed description given hereinafter. However, it should be understood that the detailed description and specific examples, while indicating preferred embodiments of the invention, are given by way of illustration only, since various changes and modifications within the sprit and scope of the invention will become apparent to those skilled in the art from this detailed description.

BRIEF DESCRIPTION OF THE DRAWINGS

The present invention will more fully be understood from the detailed description given hereinafter and accompanying drawings which are given by way of illustration only, and thus are not limitative of the present invention and wherein.

DETAILED DESCRIPTION OF THE PREFERRED EMBODIMENTS

Figure 1A:
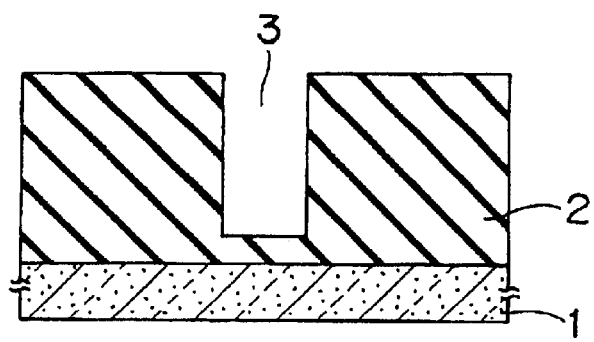
FIGS. 1A through 1D are schematic cross sectional views of the semiconductor device, illustrating each step of a process for forming an embedded wire according to Embodiment 1.

Embodiment 1.

Referring to FIGS. 1A through 1D, a process for forming an embedded wire according to Embodiment 1 of the present invention will be described hereinafter. The process includes Steps 1 through 4 corresponding to FIGS. 1A through 1D as illustrated.

Step 1:

A silicon substrate 1 having an insulating layer 2 of interlayer dielectrics thereon is prepared. A conventional photolithography and etching technique is used to form a pit 3 such as a hole and/or trench.

Step 2:

A barrier metal layer 4 of metal nitride such as TaN containing a high melting-point metal is deposited on the insulating layer 2 by sputtering or chemical vapor deposition (CVD). The barrier metal can be deposited so as to have substantially the same thickness on an inner side wall of the pit 3 as well as on the insulating layer 2. The high melting-point metal includes Ta, Mo, Zr, Hf, W and others.

Next, a plasma nitridation on the barrier metal 4 by applying nitrogen plasma thereon forms a stabilized nitride layer in the vicinity of a top surface of the barrier metal 4. The stabilized nitride layer has a stoichiometrically stable composition. In particular, the silicon substrate 1 having the barrier metal layer 4 formed thereon is disposed within the atmosphere of $N_2$ or $NH_3$ plasma to form the stabilized nitride layer adjacent to the top surface of the barrier metal layer 4. The stabilized nitride layer is composed of nitrogen and high melting-point metal by the composition ratio leading stoichiometrical stabilization. Also, the stabilized nitride layer may have the thickness, for example, of 5 nm. Preferably, the deposition of the barrier metal layer 4 and the plasma nitridation thereon may succeedingly be processed in a vacuum chamber.

Although described hereinafter in detail, the stabilized nitride layer contains nitrogen and oxygen, in which the number of nitrogen atoms is as approximately 0.4 times many as or more than that of oxygen atoms.

Step 3:

The silicon substrate 1 having the barrier metal layer 4 with the stabilized nitride layer thereon is immersed in a copper plating solution (not shown) for an electroless plating treatment. The electroless copper plating solution used for the experiment was composed of $CuSO_4 \cdot 5H_2O$, 7.6 g/liter; ethylene-diamine-tetraacetic acid (EDTA), 70.0 g/liter; glyoxylic acid, 14.0 g/liter as a reducing agent; and some additional agents. The pH of the plating solution was adjusted to about 12.3 by tetramethylammonium hydroxide (TMAH). Also, the temperature of the plating solution was maintained at 70 degrees Celsius. In the electroless plating treatment, the high melting-point metal contained in the barrier metal layer 4 is ionized to provide electrons, which are in turn, received by the copper ions in the plating solution to reduce the copper metal deposited on the barrier metal layer 4. This is so-called a displacement plating where the high melting-point metal is displaced by copper. Eventually, a copper plating layer (electroless plating layer) 5 is formed on the barrier metal layer 4 so that the pit 3 is filled up with copper metal.

Step 4:

A technique of Chemical Mechanical Planarization (CMP) is used to remove the barrier metal layer 4 and the copper plating layer 5 formed only on a top surface of the insulating layer 2, leaving the barrier metal layer 4 and the copper plating layer 5 formed within the pit 3. Thus, an embedded wire 10 is obtained, which is composed of wiring material of copper. Preferably, the substrate 1 having the embedded wire 10 may be annealed at about 300 degrees Celsius for approximately 30 minutes in the atmosphere of reducing gas so that cohesion between the barrier metal 4 and the copper plating layer 5 is improved.

Modification 1.

Next, referring to FIGS. 1A, 1B and 2C through 2E, an alternative process for forming an embedded wire according to Modification 1 of the present invention will be described hereinafter. The process includes Steps 1 through 5 corresponding to FIGS. 1A, 1B and 2C through 2E as illustrated.

Figure 1B:
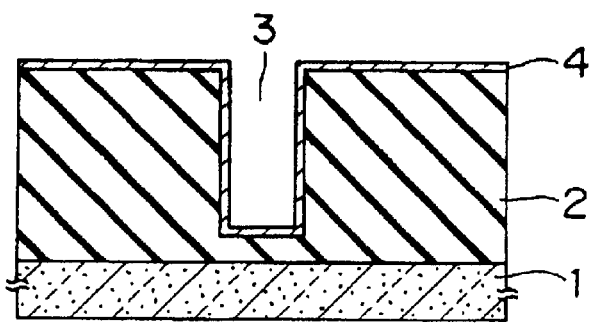

Steps 1 and 2:

As shown in FIG. 1A (Step 1 of Embodiment 1), the pit 3 is formed on the silicon dioxide layer 2 of the silicon substrate 1. As illustrated in FIG. 1B (Step 2 of Embodiment 1), the barrier metal layer 4 of metal nitride containing high melting-point metal is formed on the insulating layer 2 and the inner side walls of the pit 3. Also, the stabilized nitride layer is formed on the barrier metal 4.

Step 3:

Similar to Step 3 of Embodiment 1, the copper plating layer 5 is deposited on the stabilized nitride layer of the barrier metal layer 4 by electroless plating (displacement plating). However, as clearly illustrated in FIG. 2C, the copper plating layer 5 of Modification 1 is thinner than that of Embodiment 1 so that the pit 3 is not thoroughly filled up with the copper plating layer 5.

Figure 2C:
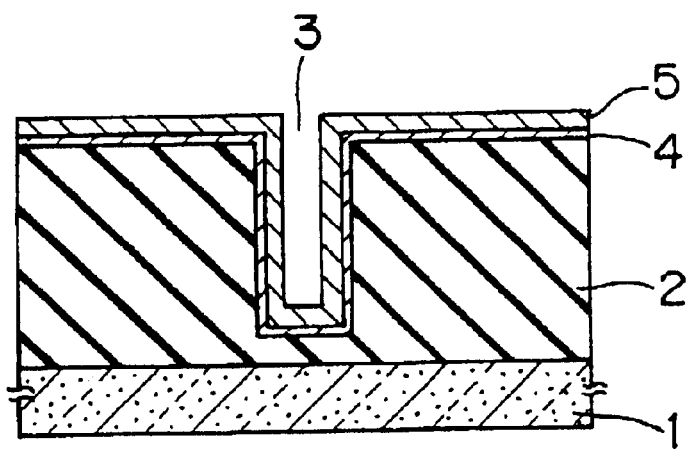
FIGS. 2C through 2E are schematic cross sectional views of the semiconductor device, illustrating each step of an alternative process for forming the embedded wire according to Modification 1.
Figure 2D:
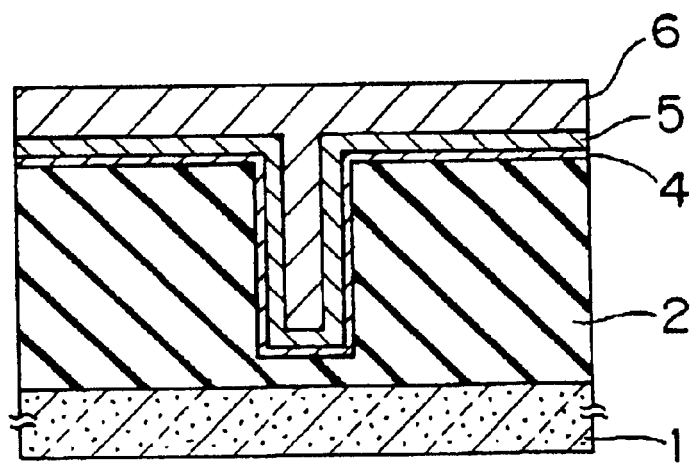
Figure 2E:
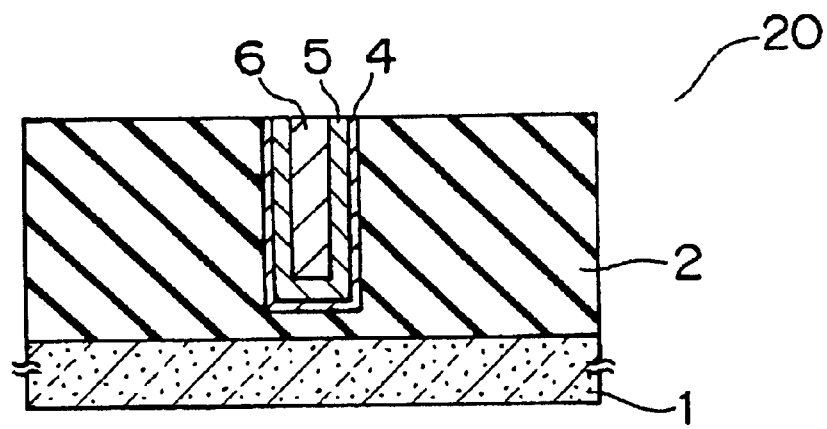

Step 4:

The copper plating layer 5 formed by electroless plating is used as a seed layer to form an electroplating copper layer 6 by electroplating so that the pit 3 is completely filled up with the electroplating copper layer 6, as shown in FIG. 2D.

Step 5:

Then, the copper layers 5, 6 deposited by electroless plating and electroplating, respectively, are polished to remove the copper layers 5, 6 formed only on the top surface of the insulating layer 2, thereby achieving the embedded wire 20.

As described above, according to the present invention, the embedded wire of copper can be formed by electroless plating without using a catalyzing layer of Pd. Also, the present invention enables a very fine pit to be thoroughly filled up with copper so that a semiconductor device including a multiple-stacked wire structure having the high density and the fine pitch can be manufactured in a efficient manner.

Also, according to the present invention, since the use of the particular and expensive sputtering system as described in the conventional process is not necessary, the manufacturing cost of the semiconductor device can substantially be reduced.

It should be noted that the present invention can be adapted both to a single and dual damascene processes in forming the embedded copper layer. Also, the present invention illustrated by Embodiments 2 through 4 as will be described hereinafter can be used in the both damascene processes.

Embodiment 2.

In a process for forming an embedded wire according to Embodiment 2 of the present invention, first, the pit 3 is formed on the insulating layer 2 of the silicon substrate 1 as illustrated in FIG. 1A and similar to Embodiment 1.

Also, the barrier metal layer 4 of metal nitride containing high melting-point metal is formed by CVD on the insulating layer 2 and the inner side wall of the pit 3 as shown in FIG. 1A.

According to Embodiment 2 of the present invention, unlike to Embodiment 1, the top surface of the barrier metal layer 4 is etched instead of plasma nitridation. In particular, the top surface of the barrier metal layer 4 may be etched, for example, by immersing it within about 1% hydrofluoric acid for about 30 seconds.

Next, the copper plating layer 5 is formed by electroless plating that is the similar step as described with reference to FIG. 1C. Preferably, such electroless plating is processed immediately after etching the barrier metal layer 4.

Figure 1C:
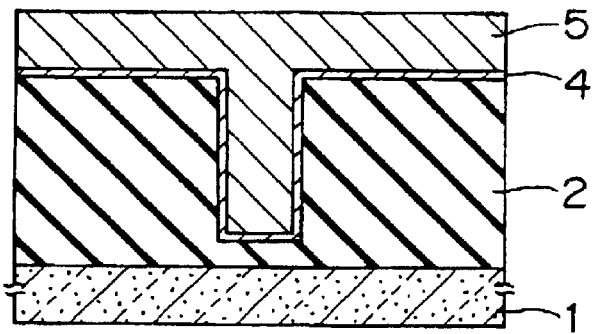
Figure 1D:
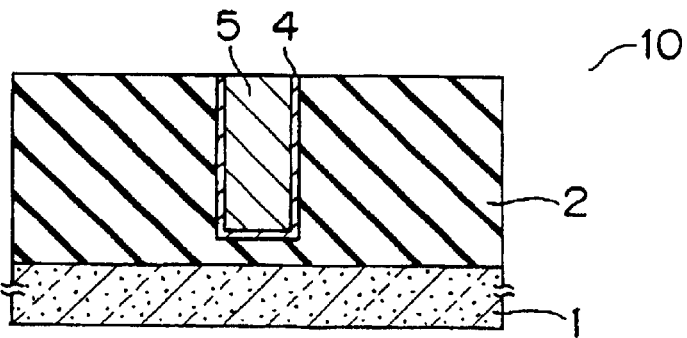

Similar to Embodiment 1 and as indicated in FIG. 1D, the CMP process is used to remove the barrier metal layer 4 and the copper plating layer 5 formed only on the top surface of the insulating layer 2, so as to form the embedded wire 10 of copper.

Figure 3A:
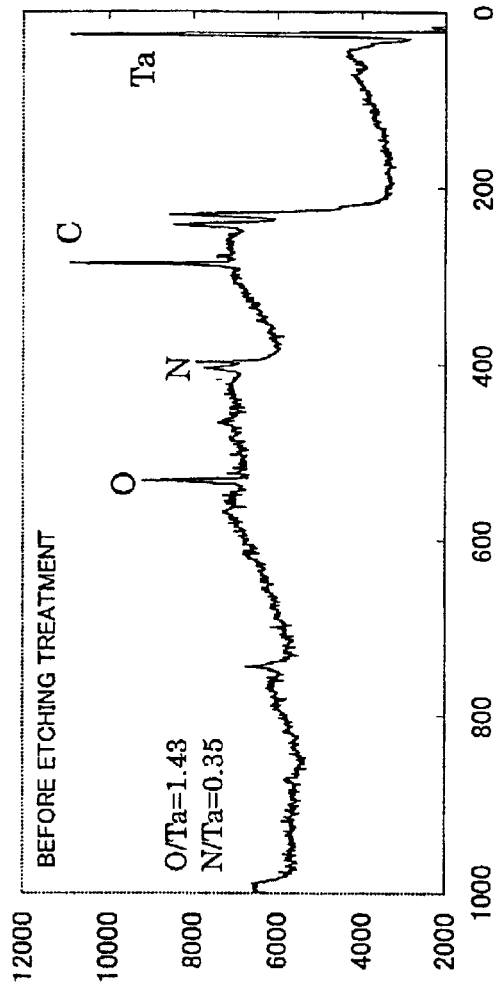
FIGS. 3A through 3B are graphs showing x-ray photoemission spectrums obtained by a x-ray photoemission spectroscopy for the barrier metals before and after being etched, respectively.
Figure 3B:
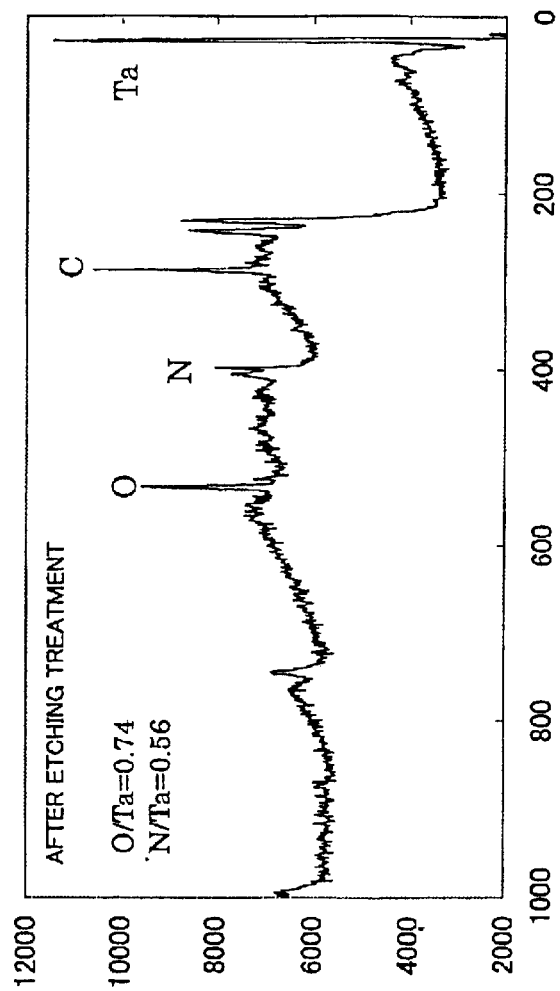

FIGS. 3A and 3B illustrate x-ray photoemission spectrums obtained by a x-ray photoemission spectroscopy for the barrier metals 4 made of TaN before and after an etching treatment with about 1% hydrofluoric acid for about 10 minutes, respectively.

As shown in FIGS. 3A and 3B, oxygen was detected in the barrier metals 4 both before and after the etching treatment. Also, a composition ratio R of the number of nitrogen atoms N(n) over the number of oxygen atoms N(o) (that is, R=N(n)/N(o)) can be defined, which is 0.24 before the etching treatment and 0.76 thereafter.

Two samples having the barrier metal layer 4 were prepared, in which one of them was etched as above and the other was not. Then, the samples were processed by the electroless plating. As the result, while the copper plating layer 5 with good quality was formed on the etched barrier metal layer 4, no copper plating layer 5 was formed on the barrier metal layer 4 without being etched.

Therefore, in order to obtain the copper plating layer 5 with good quality, preferably, the composition in the vicinity of the top surface of the barrier metal layer 4 is close to a stoichiometrical composition having no oxygen. This is because as the number of oxygen atoms N(o) contained in the barrier metal layer 4, especially in the vicinity of the top surface thereof increases, the barrier metal layer 4 has the redox potential (oxidation-reduction potential) higher than that of the copper plating layer 5.

As can be seen from FIG. 3B, the barrier metal layer 5 with good quality can be obtained if the aforementioned composition ratio R of the number of nitrogen atoms N(n) over the number of oxygen atoms N(o) is approximate 0.76. Also, the present inventors has confirmed that the barrier metal layer 5 can be effectively formed if the composition ratio R is about 0.4 or more.

Embodiment 3.

In a process for forming an embedded wire according to Embodiment 3 of the present invention, first, the pit 3 is formed on the insulating layer 2 of the silicon substrate 1 as illustrated in FIG. 1A and similar to Embodiment 1.

Next, according to Embodiment 3 of the present invention, for example, the CVD process may be used optimizing CVD conditions such as flow rates of Ar and $N_2$ gases introduced into a CVD chamber so as to form the barrier metal layer 4 of high melting-point metal on the insulating layer 2 and the pit 3. This optimized CVD process causes the barrier metal layer 4 of high melting-point metal to substantially have the stoichiometrical composition.

The barrier metal layer 4 of high melting-point metal substantially having the stoichiometrical composition is stable in the vicinity of the top surface thereof, and hardly trap oxygen in the barrier metal layer 4, even if it is treated in the atmosphere. In this instance, similar to the other embodiments, the composition ratio R of the number of nitrogen atoms N(n) over the number of oxygen atoms N(o) is controlled as approximate 0.4 or more.

Next, similar steps shown in FIGS. 1C and 1D are processed to form the embedded wire of copper. Also, it should be noted that the electroless plating is preferably achieved soon after forming the barrier metal 4.

Embodiment 4.

Referring to FIGS. 4A through 4D, a process for forming an embedded wire according to Embodiment 4 of the present invention will be described hereinafter. The process includes Steps 1 through 4 corresponding to FIGS. 4A through 4D as illustrated. In FIGS. 4A through 4D, similar components are denoted as to similar reference numerals shown in FIGS. 1A through 1D.

Figure 4A:
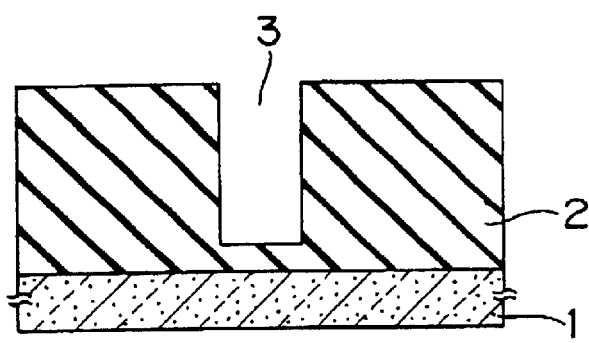
FIGS. 4A through 4D are schematic cross sectional views of the semiconductor device, illustrating each step of a process for forming the embedded wire according to Embodiment 4.
Figure 4B:
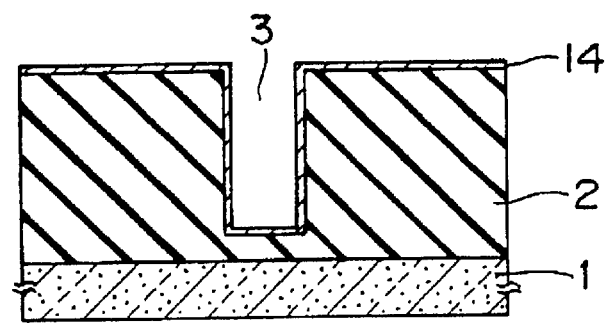
Figure 4C:
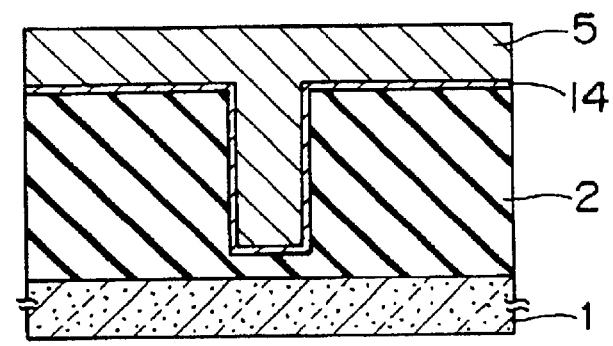
Figure 4D:
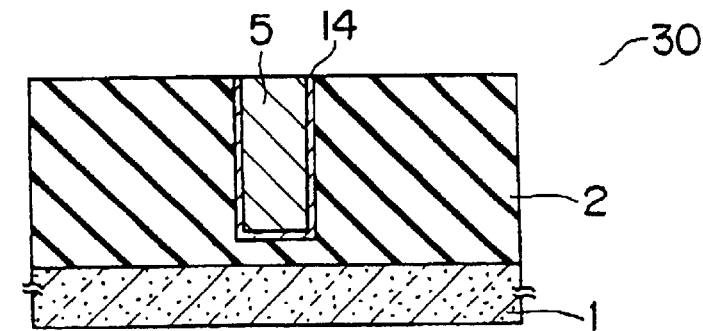

Step 1:

As illustrated in FIG. 4A and similar to Embodiment 1, the pit 3 is formed on the insulating layer 2 of the silicon substrate 1.

Step 2:

The CVD process is used to form the barrier metal layer 4 mainly made of high melting-point metal, including for example titanium, cobalt, and alloy thereof, on the insulating layer 2 and the pit 3. The barrier metal layer 4 so composed are so stable that no plasma nitridation is required.

Step 3:

The silicon substrate 1 having the stable barrier metal layer 4 is immersed in the copper plating solution (not shown) for electroless plating. Thus, the copper plating layer 5 is formed so as to fill up the pit 3 with copper metal.

Step 4:

The CMP process is used to remove the barrier metal layer 4 and the copper plating layer 5 formed only on a top surface of the insulating layer 2, leaving the barrier metal layer 4 and the copper plating layer 5 formed within the pit 3. Thus, an embedded wire 30 is obtained, which is made of wiring material of copper.

Also, as described in Modification 1, Embodiment 4 can be modified to use an electroplating step as well as the electroless plating step.

Clearly understood from the above description, the electroless plating according to the present invention eliminates a necessity of the catalyzing layer (agent) and enables the fine pit to be formed so that a semiconductor device including a multiple-stacked wire structure having the high density and the fine pitch can be realized.

What is claimed is:

1. An electroless plating process of copper, comprising steps of:

preparing a substrate;

forming a metal nitride layer containing high melting-point metal on the substrate, the high melting point metal being selected from the group consisting of Ta, Mo, Zr, Hf, W, Ti, Co and alloys thereof, the metal nitride layer having a stabilized nitride layer in the vicinity of a top surface thereof, the stabilized nitride layer having a composition ratio of nitrogen atoms over oxygen atoms, which is about 0.4 or more;

immersing the substrate into a plating solution containing copper so as to displace high melting-point metal contained in the metal nitride layer by coppery thereby forming an electroless copper plating layer on the metal nitride layer.

2. The process according to claim 1,
wherein the stabilized nitride layer has a depth of approximately 5 nm.

3. The process according to claim 1,
wherein the stabilized nitride layer is formed by applying nitrogen plasma on the top surface of the metal nitride layer formed on the substrate.

4. The process according to claim 1,
wherein the stabilized nitride layer is formed by removing the top surface of the metal nitride layer formed on the substrate.

5. The process according to claim 1,
wherein the stabilized nitride layer is formed by depositing the metal nitride layer substantially having the stoichiometrical composition.

6. An electroless plating process of copper, comprising steps of:
preparing a substrate;
forming a metal layer on the substrate, the metal layer mainly made of high melting-point metal being selected from the group consisting of Ta, Mo, Zr, Hf, W, Ti, Co and alloys thereof;
immersing the substrate into a plating solution containing copper so as to displace the high melting-point metal by copper, thereby forming an electroless copper plating layer on the metal layer.

7. A process for forming an embedded wire of copper, comprising steps of:
preparing a substrate;
forming a pit on the substrate;
forming a barrier metal layer containing high melting-point metal on the substrate, the high melting point metal being selected from the group consisting of Ta, Mo, Zr, Hf, W, Ti, Co and alloys thereof, the barrier metal layer having a stabilized nitride layer in the vicinity of a top surface thereof, the stabilized nitride layer having a composition ratio of nitrogen atoms over oxygen atoms, which is about 0.4 or more;
immersing the substrate into a plating solution containing copper so as to displace high melting-point metal contained in the barrier metal layer by copper, thereby forming an electroless copper plating layer on the barrier metal layer.

8. The process according to claim 7,
wherein the stabilized nitride layer is formed by applying nitrogen plasma on the top surface of the barrier metal layer formed on the substrate.

9. The process according to claim 7, further comprising a step of:
forming an electroplating layer of copper on the electroless plating layer using as a seed layer.

10. An embedded wire of copper, comprising:
a substrate;
a pit formed on said substrate;
a barrier metal layer of metal nitride containing thigh melting-point metal formed on an inner side wall of said pit, the high melting point metal being selected from the group consisting of Ta, Mo, Zr, Hf, W, Co and alloys thereof;
a copper plating layer formed on said barrier metal layer, filling the pit up with copper metal; and
a stabilized nitride layer at an interface between said barrier metal layer and said copper plating layer;
wherein said stabilized nitride layer has a composition ratio of the number of nitrogen atoms over the number of oxygen atoms contained therein, which is about 0.4 or more.

11. The embedded wire according to claim 10,
wherein said stabilized nitride layer has a thickness of approximately 5 nm.

12. An electroless plating process of copper, comprising steps of:
preparing a substrate;
forming a metal nitride layer containing a high melting-point metal on the substrate, the high melting point metal being selected from the group consisting of Ta, Mo, Zr, Hf, W, Ti, Co and alloys thereof;
treating the metal nitride layer so that a copper layer can be formed on the metal nitride layer by electroless plating without first forming a metal seed layer on the nitride layer, a treated portion of the metal nitride layer having a composition ratio of nitrogen atoms over oxygen atoms which is about 0.4 or more;
immersing the substrate into a plating solution containing copper so as to displace high melting-point metal contained in the metal nitride layer by copper, thereby forming an electroless copper plating layer on the treated portion of the metal nitride layer.

13. An electroless plating process of copper, comprising steps of:
preparing a substrate;
forming a metal nitride layer containing a high melting-point metal on the substrate, the high melting point metal being selected from the group consisting of Ta, Mo, Zr, Hf, W, Ti, Co and alloys thereof;
applying nitrogen plasma on a top surface of the metal nitride layer, a vicinity of the top surface of the nitride layer having a composition ratio of nitrogen atoms over oxygen atoms which is about 0.4 or more;
immersing the substrate into a plating solution containing copper so as to displace high melting-point metal contained in the metal nitride layer by copper, thereby forming an electroless copper plating layer on the metal nitride layer.

14. An electroless plating process of copper, comprising steps of:
preparing a substrate;
forming a metal nitride layer containing a high melting-point metal on the substrate, the high melting point metal being selected from the group consisting of Ta, Mo, Zr, Hf, W, Ti, Co and alloys thereof;
etching a top surface of the metal nitride layer, a vicinity of the top surface of the nitride layer having a composition ratio of nitrogen atoms over oxygen atoms which is about 0.4 or more; and then
immersing the substrate into a plating solution containing copper so as to displace high melting-point metal contained in the metal nitride layer by copper, thereby forming an electroless copper plating layer on the metal nitride layer.

15. An electroless plating process of copper, comprising steps of:

preparing a substrate;

forming a metal nitride layer containing a high melting-point metal on the substrate, the high melting point metal being selected from the group consisting of Ta, Mo, Zr, Hf, W, Ti, Co and alloys thereof, the metal nitride layer being formed with a stoichiometric composition that enables a copper layer to be formed on the metal nitride layer by electroless plating without first forming a metal seed layer on the nitride layer;

immersing the substrate into a plating solution containing copper so as to displace high melting-point metal contained in the metal nitride layer by copper, thereby forming an electroless copper plating layer on the metal nitride layer.

16. A process for forming an embedded wire of copper, comprising steps of:

preparing a substrate;

forming a pit on the substrate;

forming a metal nitride layer containing a high melting-point metal on the substrate including in the pit, the high melting point metal being selected from the group consisting of Ta, Mo, Zr, Hf, W, Ti, Co and alloys thereof;

treating the metal nitride layer so that a copper layer can be formed on the metal nitride layer by electroless plating without first forming a metal seed layer on the nitride layer, a treated portion of the metal nitride layer having a composition ratio of nitrogen atoms over oxygen atoms which is about 0.4 or more;

immersing the substrate into a plating solution containing copper so as to displace high melting-point metal contained in the metal nitride layer by copper, thereby forming an electroless copper plating layer on the treated portion of the metal nitride layer.

17. A process for forming an embedded wire of copper, comprising steps of:

preparing a substrate;

forming a pit on the substrate;

forming a metal nitride layer containing a high melting-point metal on the substrate including in the pit, the high melting point metal being selected from the group consisting of Ta, Mo, Zr, Hf, W, Ti, Co and alloys thereof;

applying nitrogen plasma on a top surface of the metal nitride layer, a vicinity of the top surface of the nitride layer having a composition ratio of nitrogen atoms over oxygen atoms which is about 0.4 or more;

immersing the substrate into a plating solution containing copper so as to displace high melting-point metal contained in the metal nitride layer by copper, thereby forming an electroless copper plating layer on the metal nitride layer.

18. A process for forming an embedded wire of copper, comprising steps of:

preparing a substrate;

forming a pit on the substrate;

forming a metal nitride layer containing a high melting-point metal on the substrate including in the pit the high melting point metal being selected from the group consisting of Ta, Mo, Zr, Hf, W, Ti, Co and alloys thereof;

etching a top surface of the metal nitride layer, a vicinity of the top surface of the nitride layer has a composition ratio of nitrogen atoms over oxygen atoms which is about 0.4 or more; and then immersing the substrate into a plating solution containing copper so as to displace high melting-point metal contained in the metal nitride layer by copper, thereby forming an electroless copper plating layer on the metal nitride layer.

19. A process for forming an embedded wire of copper, comprising steps of:

preparing a substrate;

forming a pit on the substrate;

forming a metal nitride layer containing a high melting-point metal on the substrate including in the pit, the high melting point metal being selected from the group consisting of Ta, Mo, Zr, Hf, W, Ti, Co and alloys thereof;

forming a metal nitride layer containing a high melting-point metal on the substrate, the metal nitride layer being formed with a stoichiometric composition that enables a copper layer to be formed on the metal nitride layer by electroless plating without first forming a metal seed layer on the nitride layer;

immersing the substrate into a plating solution containing copper so as to displace high melting-point metal contained in the metal nitride layer by copper, thereby forming an electroless copper plating layer on the metal nitride layer.

* * * * *